United States Patent
Cazals

(10) Patent No.: US 8,069,019 B2
(45) Date of Patent: Nov. 29, 2011

(54) METHOD AND AIDS FOR RELATIVE POSITIONING OF OBJECTS DURING A DESIGN PHASE

(75) Inventor: Olivier Cazals, Daux (FR)

(73) Assignee: Airbus Operations SAS, Toulouse (FR)

( * ) Notice: Subject to any disclaimer, the term of this patent is extended or adjusted under 35 U.S.C. 154(b) by 336 days.

(21) Appl. No.: 12/447,155

(22) PCT Filed: Oct. 24, 2007

(86) PCT No.: PCT/FR2007/001756
§ 371 (c)(1),
(2), (4) Date: Apr. 24, 2009

(87) PCT Pub. No.: WO2008/056055
PCT Pub. Date: May 15, 2008

(65) Prior Publication Data
US 2010/0049475 A1    Feb. 25, 2010

(30) Foreign Application Priority Data
Oct. 27, 2006  (FR) .................................. 06 54600

(51) Int. Cl.
*G06F 17/50* (2006.01)
*G06F 3/00* (2006.01)
(52) U.S. Cl. ................... 703/2; 703/1; 703/7; 345/419; 345/420; 700/97
(58) Field of Classification Search ................ 703/2, 7, 703/1; 345/419, 420; 700/97
See application file for complete search history.

(56) References Cited

U.S. PATENT DOCUMENTS 5,754,738 A    5/1998    Saucedo et al.
(Continued)

FOREIGN PATENT DOCUMENTS

EP    1 056 026 A2    11/2000
(Continued)

OTHER PUBLICATIONS

S. Agostinelli, et al., "GEANT4—a simulation toolkit", Nuclear Instruments and Methods in Physics Research, Section A, vol. 506, No. 3, XP004431463, 2003, pp. 250-303.

(Continued)

*Primary Examiner* — Thai Phan
(74) *Attorney, Agent, or Firm* — Oblon, Spivak, McClelland, Maier & Neustadt, L.L.P.

(57) ABSTRACT

A method aiding in relative positioning of 3D objects, in a complex environment involving several techniques, according to a set of geometrical and/or mathematical constraints. A parametric model is selected for each of the objects, parametric models including models of the constraints are also selected. A representation of one of the objects is displayed, permitting positioning of another object and the display of a representation of the positioning. A piece of data relating to the position of one of the objects is accessed for each parametric model including a constraint modeling and a piece of data relating to the position of one of the objects is accessed to permit an evaluation of the corresponding constraint. When an object is added or displaced the relative positions of the objects and the constraints are reevaluated.

13 Claims, 10 Drawing Sheets

U.S. PATENT DOCUMENTS

| | | | |
|---|---|---|---|
| 6,385,563 B1 | 5/2002 | Vora et al. | |
| 6,614,430 B1 * | 9/2003 | Rappoport | 345/420 |
| 6,985,835 B1 * | 1/2006 | Etzion et al. | 703/1 |
| 7,013,468 B2 * | 3/2006 | Abercrombie et al. | 719/328 |
| 7,099,803 B1 * | 8/2006 | Rappoport et al. | 703/1 |
| 2005/0135664 A1 * | 6/2005 | Kaufhold et al. | 382/131 |
| 2005/0209830 A1 | 9/2005 | Lee et al. | |

FOREIGN PATENT DOCUMENTS

| | | |
|---|---|---|
| GB | 2 292 657 A | 2/1996 |
| WO | WO 99/28849 | 6/1999 |
| WO | WO 2004/010384 A2 | 1/2004 |
| WO | WO 2005/111797 A2 | 11/2005 |

OTHER PUBLICATIONS

Satoshi Tanaka, "A Visual Intersection Debugger for Modeling Geant4 Detector Geomrtry—David-", Department of Information Science, Fukui University, XP-002427236, 1998, 3 pages.

* cited by examiner

METHOD AND AIDS FOR RELATIVE POSITIONING OF OBJECTS DURING A DESIGN PHASE

The present invention relates to the design of three-dimensional objects composed of a plurality of elements and more particularly to a method and devices for aiding in the positioning of a first object relative to a second object according to a set of geometric and mathematical constraints during a design phase.

The design of complex assemblies such as airplanes requires the relative positioning of a plurality of elements. The positioning of a first element relative to a second generally involves different disciplines. For example, the positioning of an engine on an airplane wing requires consultation between engine designers, mechanical engineers, aerodynamic engineers, acoustic engineers and specialists of numerous other disciplines.

Traditionally, the study of positioning is organized in the form of successive partial analyses. The specialists of the disciplines having the greatest consequences associated with the choice of positioning on the basis of predetermined criteria are entrusted with beginning the study and proposing a first position. The study is then passed on to a specialist of another discipline, who will add to it, and so on. When all disciplines have participated in the study, the file is generally sent back to each for validation of the result. If the positioning has been modified during the study and certain criteria for a particular discipline are no longer met, the positioning must be modified and the succession of partial analyses must be repeated by all disciplines in order to validate the new position.

Because of the number of different disciplines involved, it is generally not possible to manage the process dynamically. This therefore results in considerable delays and a lack of an overall view of the process that would permit each discipline to have a simple understanding of the problems of the other disciplines.

A need therefore exists for optimizing the placement of a first object relative to a second object in a complex environment involving a set of constraints and requiring the intervention of different disciplines.

The invention makes it possible to solve at least one of the problems described in the foregoing.

Thus the object of the invention is a method for aiding in the positioning of a first object relative to a second object according to at least one constraint associated with the relative position of the first and second objects, the method being characterized in that it comprises the following steps,
selecting a parametric model associated with each of the first and second objects;
displaying a numerical model of the second object according to the parametric model associated with the second object;
positioning the first object relative to the second object according to the parameters of the parametric models associated with the first and second objects;
displaying a numerical model of the first object according to the parametric model associated with the first object and according to the positioning;
selecting at least one parametric model comprising a modeling of the at least one constraint;
for the at least one parametric model comprising a modeling of the at least one constraint,
acquiring at least one datum associated with the position of at least one of the first and second objects;
evaluating the at least one constraint according to the at least one datum.

The method according to the invention makes it possible to conduct a positioning study having an abundant number of parameters and constraints by using a simple interface. In addition, the method is open to future constraints, which may be easily added to the study.

Preferably the method additionally comprises a step of modifying at least one parameter of at least one of the parametric models associated with the first and second objects, the steps of
acquiring at least one datum associated with the position of at least one of the first and second objects; and
evaluating the at least one constraint according to the at least one datum,
being repeated, after the modification of the at least one parameter, for the at least one parametric model comprising a modeling of the at least one constraint. The dynamic and associative management of objects and constraints permits the user to optimize the positioning of an object according to a large set of constraints by a rapid analysis of the effects of the modifications on the constraints.

In a particular embodiment, the method additionally comprises a step of displaying the result of the evaluation of the at least one constraint. Preferably the display comprises displaying a graphical indication associated with the at least one constraint in such a way that a visual analysis of the position of the graphical indication relative to at least one of the numerical models associated with the first and second objects makes it possible to validate the position of the first object according to the at least one constraint. Alternatively, or in addition, the display comprises displaying at least one value that makes it possible to validate the position of the first object according to the said at least one constraint.

According to another particular embodiment, the parametric model comprising a modeling of the at least one constraint is included in one of the parametric models associated with the first and second objects. Alternatively, at least one datum of the at least one parametric model comprising a modeling of the at least one constraint is imported from one of the parametric models associated with the first and second objects. The modeling of constraints in the parametric models of the objects to be positioned, or the use of specific data of the parametric models associated with the first and second objects, permits functional organization of the parametric models as well as reduction of the number of parameters of the parametric models to those which are necessary.

According to a particular embodiment, the second object comprises at least part of an aircraft.

According to another particular embodiment, the at least one constraint is associated with at least one of the following positions: position of doors, position of evacuation slides, position of the ground, relative position of the ground during landing in a crosswind and relative position of the ground during landing with the front landing gear retracted.

According to another particular embodiment, the first object comprises at least part of a propulsive assembly for the aircraft.

According to another particular embodiment, the at least one constraint is associated with the aerodynamics of at least part of the first object, with movable pieces of at least part of the first object, with the risk of shattering of at least part of the first object or with the noise or heat that may be emitted by at least part of the first object.

Another object of the invention is a method for a device comprising means capable of employing each of the steps of the method described in the foregoing.

Another object of the invention is a computer program comprising instructions capable of employing each of the steps of the method described in the foregoing.

Other advantages, objectives and characteristics of the present invention will become evident from the detailed description provided hereinafter by way of non-limitative example, referring to the attached drawings, wherein:

FIG. 1 shows an example of an apparatus for implementing the invention;

FIG. 2 schematically illustrates an example of the study environment for positioning a propulsive assembly on an airplane according to the invention, as well as the relationships between this study and the disciplines involved;

Figure 7A:
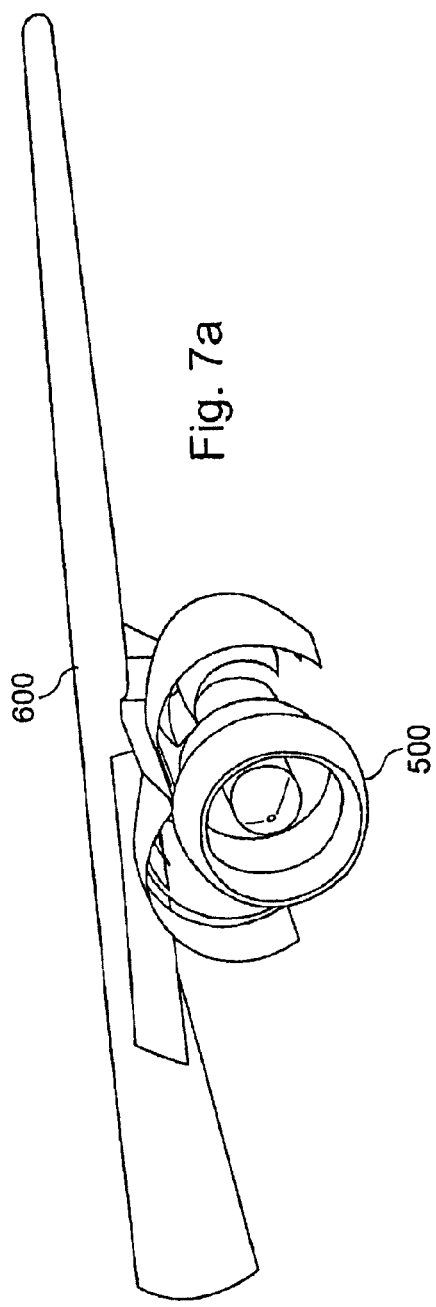
Figure 7B:
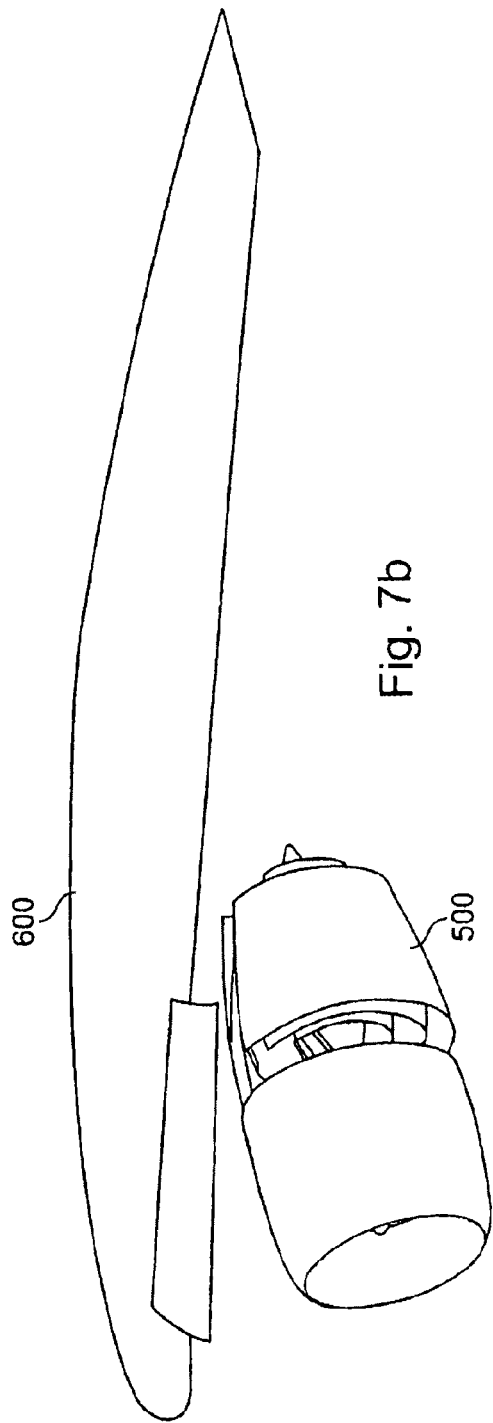
Figure 8:
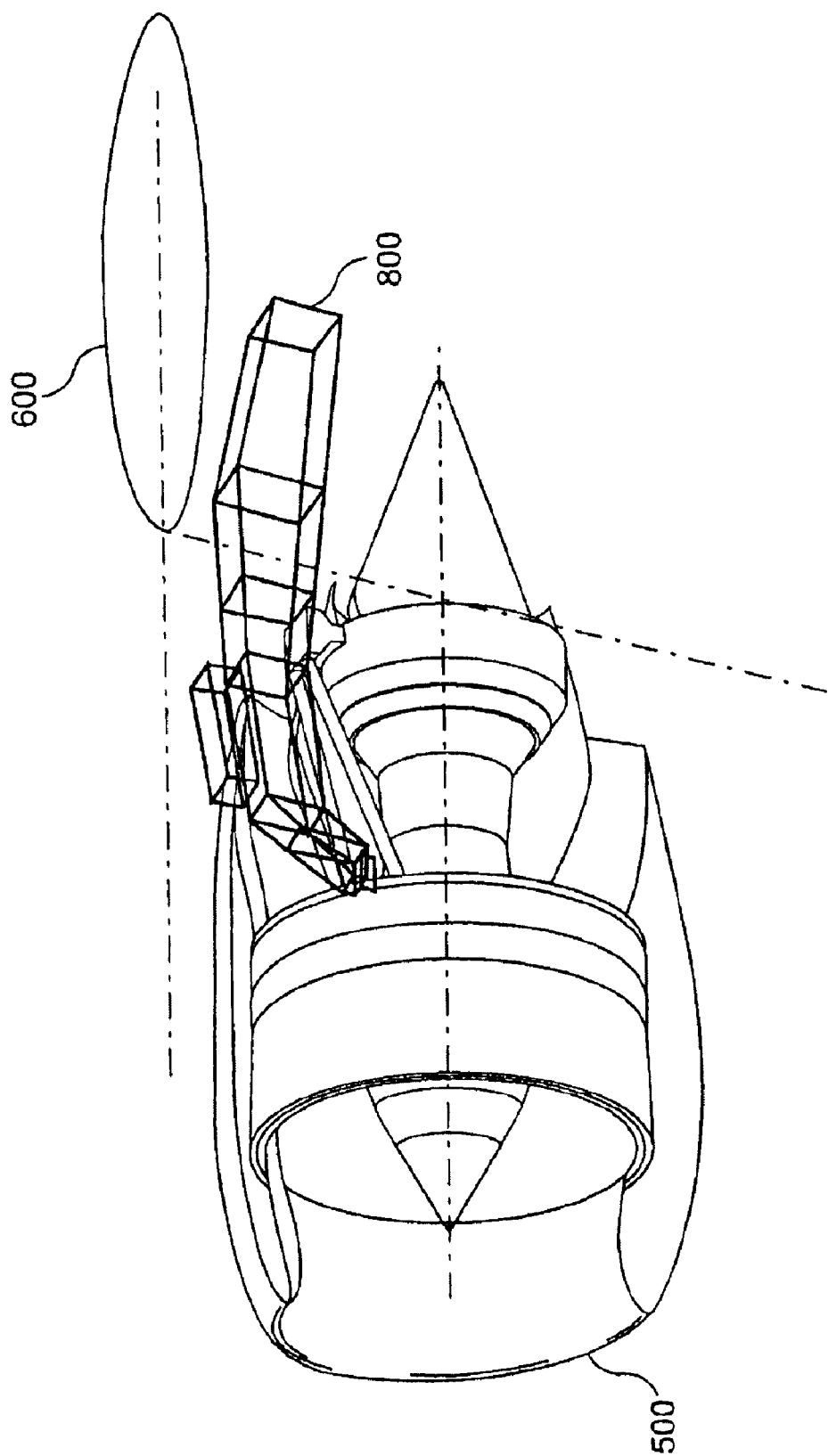
Figure 9:
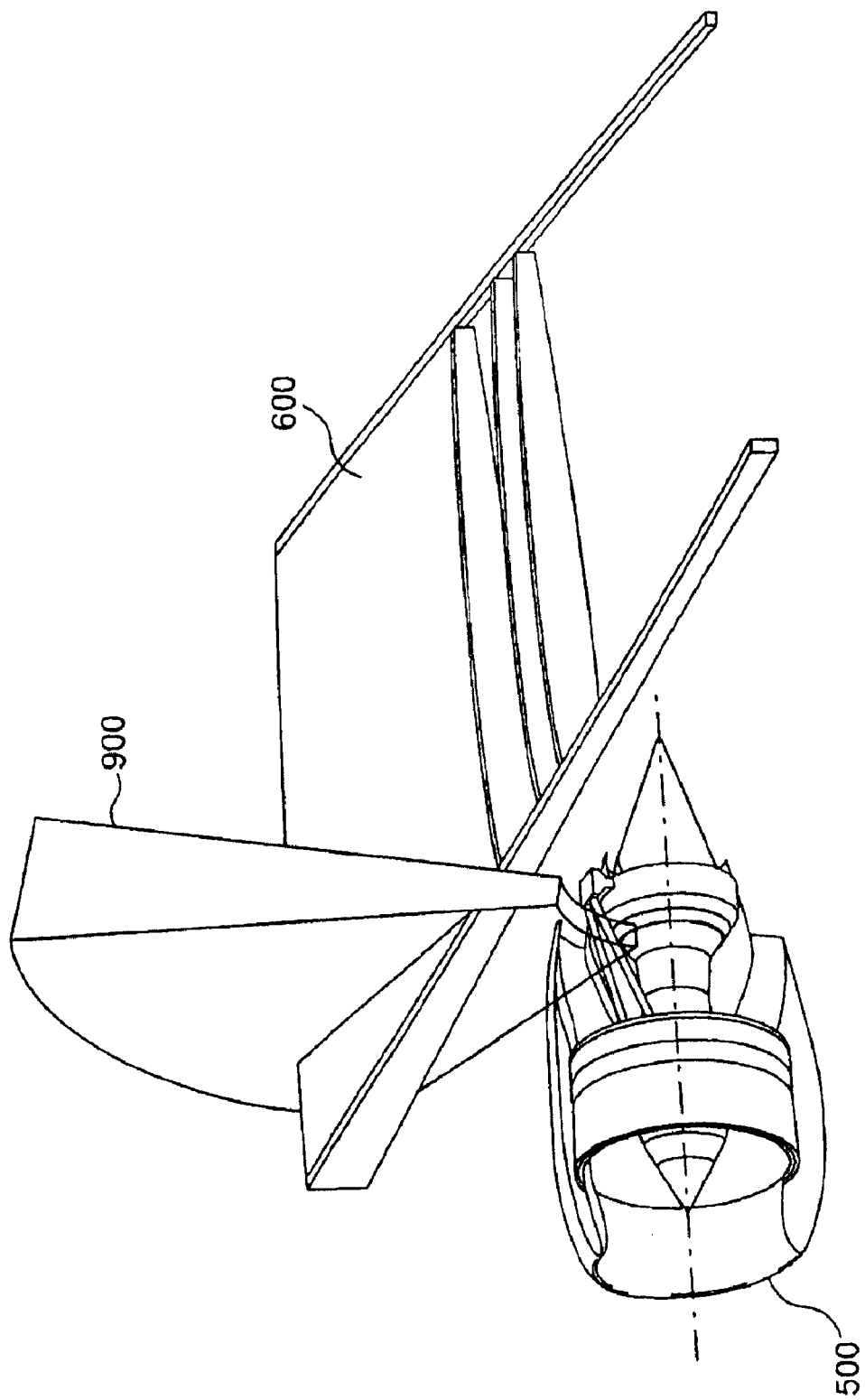

FIG. 7, comprising FIGS. 7a and 7b, illustrates the validation of the positioning of the nacelle according to the constraints associated with thrust reversal and respectively with the constraints associated with the opening of the engine cowling for maintenance of the engine;

FIG. 8 represents a line-element pylon connecting a propulsive assembly to an airplane wing;

FIG. 9 illustrates a cone of shattering of turbine blades; and

Figure 10:
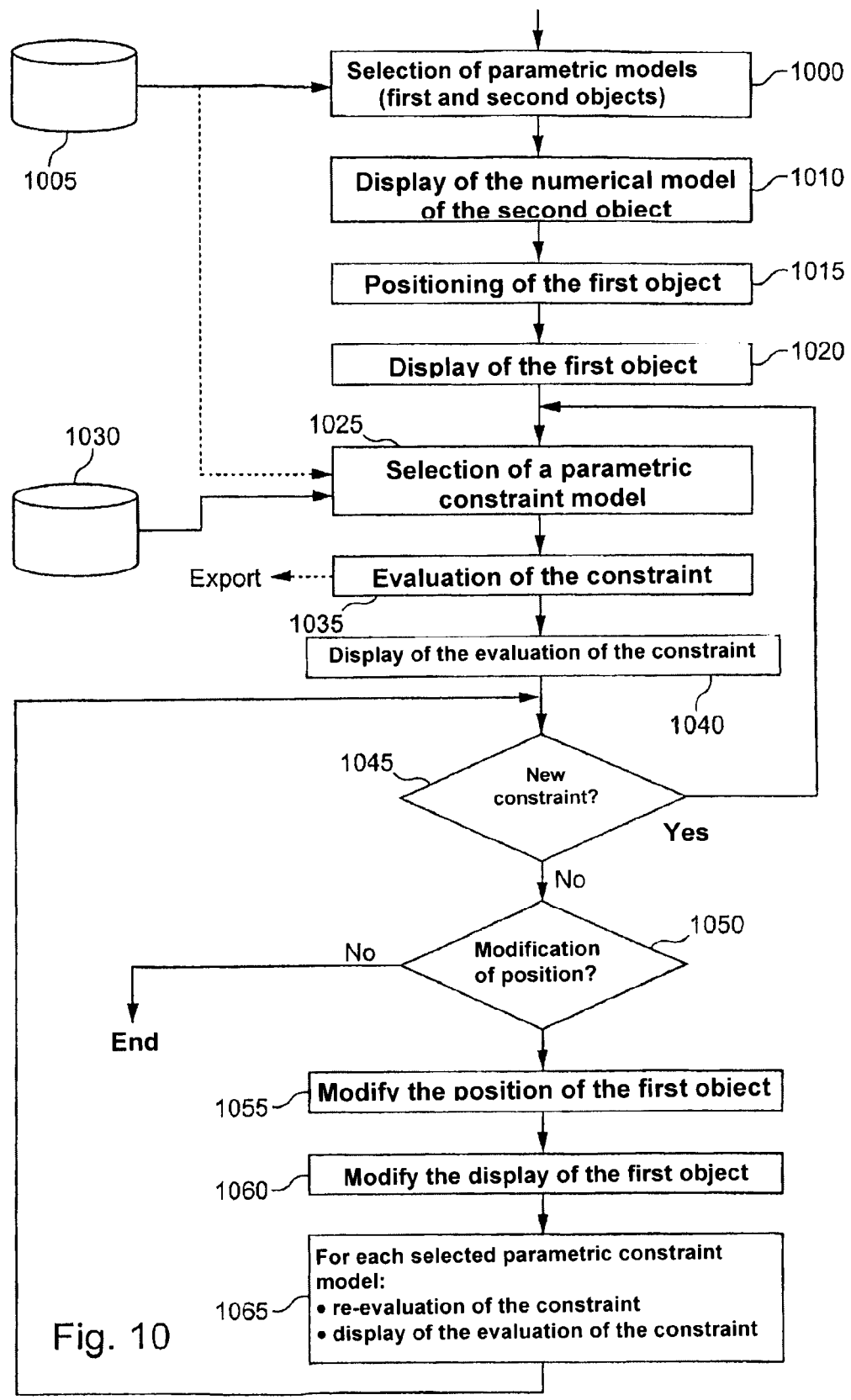

FIG. 10 schematically represents certain steps of an example of employment of the invention.

The method of the invention is a 3D validation tool intended in particular for conducting studies of engine installations on conventional and non-conventional airplanes. According to a particular implementation, the method uses Catia 3D design software to ensure associativeness of geometric models with one another and a parameter editor to modify the value of parameters of geometric models. The following description illustrates the employment of the invention in this context, but it must be understood that the invention is not limited to this particular implementation.

Catia, developed by the French company Dassault Systèmes and sold by IBM, is a computer-assisted design (CAD) software with 3D orientation, in which all steps of development of a product can be managed.

Figure 1:
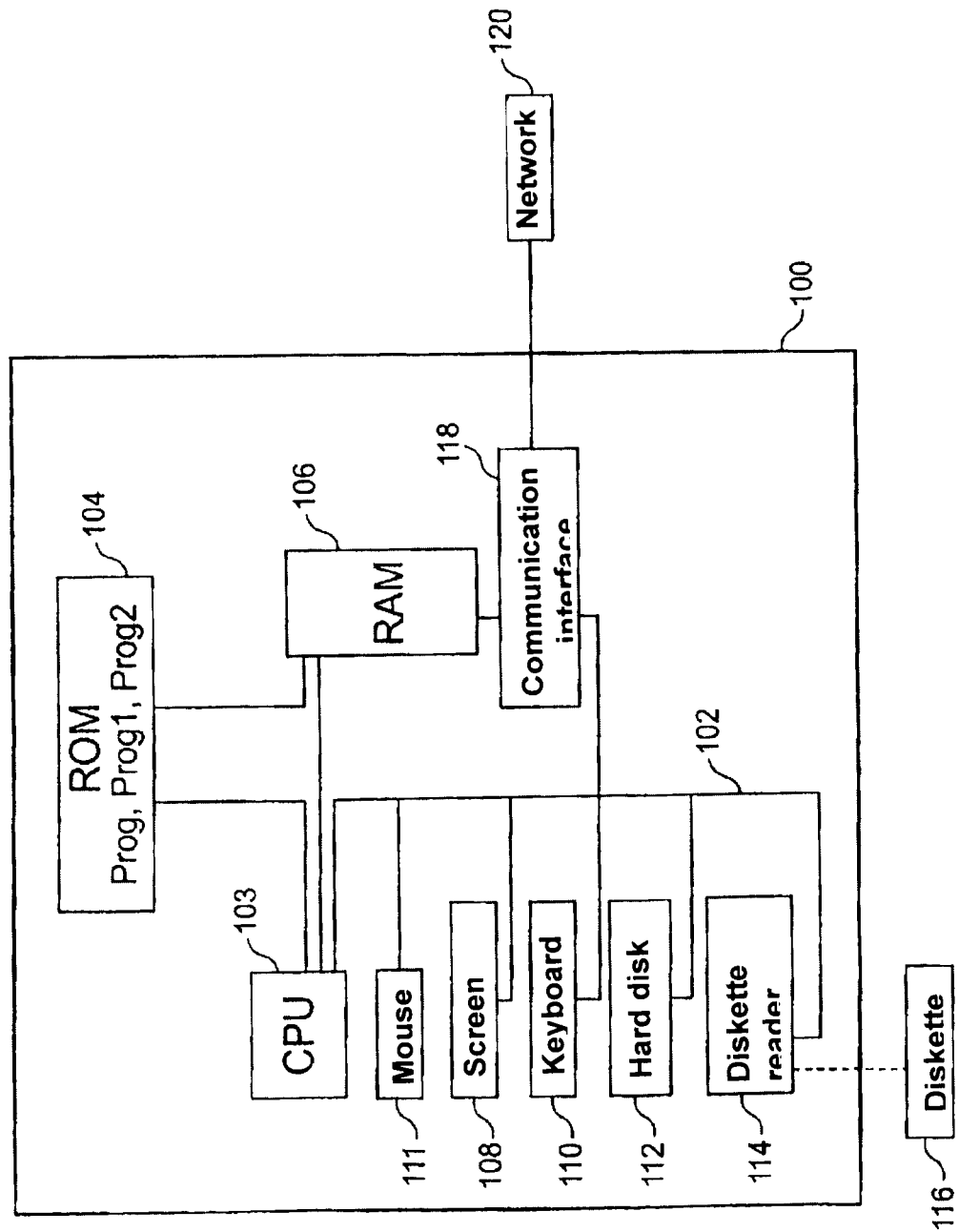

FIG. 1 illustrates an example of an apparatus 100 capable of employing the invention, such as a microcomputer or a workstation.

Preferably, apparatus 100 is provided with a communication bus 102, to which there are connected:

a central processing unit 103, such as a microprocessor;
a non-volatile memory 104 or Read Only Memory (ROM), which may be provided with one or more programs "Prog", "Prog1" and "Prog2";
a volatile memory 106 or Random Access Memory (RAM), provided with registers capable of storing in memory the variables and parameters created and modified during execution of the aforesaid programs; and
a communication interface 118 connected to a distributed communication network 120 such as the Internet, the interface being capable of transmitting and receiving data.

Optionally, apparatus 100 may be provided with one or more or all of the following devices:

a screen 108 for viewing data and/or for functioning as a graphical user interface that will be able to interact with the programs according to the invention, by means of a keyboard 110 or of any other means, such as a pointing device, for example a mouse 111 or a light pen, a touch screen or a remote controller;
a hard disk 112, which may be provided with programs and/or data, especially data processed or to be processed according to the invention;
a diskette reader 114 capable of receiving a diskette 116 and therein reading or writing data processed or to be processed according to the invention; and
a reader for memory cards, capable of therein reading or writing data processed or to be processed according to the invention.

The communication bus permits communication and interoperability between the different elements included in apparatus 100 or connected thereto. The representation of the bus is not limitative and, in particular, the central unit is capable of communicating instructions to any element of apparatus 100 directly or by way of another element of apparatus 100.

The executable code of the program or programs permitting apparatus 100 to employ the method according to the invention may be stored, for example, on hard disk 112 or in read-only memory 104.

According to one variant, diskette 116 may contain data as well as the executable code of the aforesaid programs, which, once read by apparatus 100, may be stored on hard disk 112.

Alternatively, the executable code of the programs may be received by way of communication network 120, via interface 118, to be stored in a manner identical to that described in the foregoing.

The diskettes may be replaced by any information medium such as, for example, a compact disk (CD ROM) or a memory card. In general, an information storage means that may be read by a microcomputer or a microprocessor, which may or may not be integrated in the apparatus, and which may be removable, is capable of storing in memory one or more programs whose execution permits employment of the method according to the invention.

More generally, it will be possible to load the program or programs into one of the storage means of apparatus 100 before they are executed.

Central unit 103 controls the execution of instructions or portions of software code of the program or programs according to the invention, such instructions being stored on hard disk 112, in read-only memory 104 or in the other aforesaid storage elements. During boot-up, the program or programs stored in a non-volatile memory, such as hard disk 112 or read-only memory 104, are transferred into random-access memory 106 (RAM), which then contains the executable code of the program or programs according to the invention as well as registers for storing in memory the variables and parameters necessary for employment of the invention.

It should be noted that the apparatus containing the device according to the invention may also be a programmed apparatus. For example, the instructions of the program or programs employing the invention may be implemented in a programmable or specific integrated circuit (Application Specific Integrated Circuit, ASIC).

In a design software, the templates or parametric models associated with a 3D geometry of a part or of an assembly of parts permit a user who is not specialized in the computer-assisted design software to retrieve and modify a parameter easily without knowing the result that he hopes to achieve. Thus the use of parametric models makes it possible to obtain a simplified interface for modifying the parameters without modifying the source code. This simplified interface may be presented, for example, in the form of a dialog window permitting visualization and modification of parameters in predetermined fields. The use of these parametric models also makes it possible to program certain constraints in the form of mathematical relationships. The parametric models also make it possible to present results based on predetermined mathematical relationships and on user-defined parameters or geometric data. Finally, the associative environment of parametric models permits the exchange of information that allows, for example, the positioning of 3D parts relative to one another, as well as access to information items used to calculate certain characteristics of 3D parts associated with the parametric models.

The parametric models can be associated with 3D geometric elements. In this way it is possible to extract a numerical model from the parametric model permitting visualization of the element or of a part of the element with which the parametric model is associated. The position of these elements may be defined relative to other elements of the same parametric models or relative to elements of a different parametric model. When an element is modified or displaced, the computer-assisted design software consequently modifies the relative positions of all affected elements, regardless of the parametric model to which they belong.

The module for aiding in positioning is based on the use of parametric models stored in memory in a catalog that forms a totally associative set. Each parametric model has a specific usage. Some are associated with parts of the airplane, such as the nacelle and the engine, and others represent functional entities, such as the ground and the trajectory of engine fragments in case of shattering of the engine. Different parametric models of the same 3D object may be used depending on the type of study to be conducted.

The positioning of an engine on an airplane is a compromise among several parameters, including:
the aerodynamic interactions between the engine and the wing, between the pylon (junction between a wing and a propulsive assembly composed of a nacelle and an engine) and the engine, and between the fuselage, stabilizers and engine;
the weight of the pylon as well as the dimensions and structure of the wing or fuselage reinforcements;
the weight of the landing gears;
the dimension of the vertical stabilizers;
the loss of lift of the wings;
the design of moving parts (flaps, leading edges, ailerons);
the noise level generated by the engine; and
the impact of a blade fragment on the structure of the airplane and of vital systems.

The system according to the invention makes it possible to allow for these constraints on the positioning of one or more engines in all types of airplanes. According to one example of employment of this system, the positioning of the engine as determined by the user is automatically validated relative to the following data in particular:
the distance between the nacelle and,
the ground (static ground, ground during landing in a crosswind and ground during landing when the front landing gear is retracted);
the front cabin door; and
the evacuation slide of the front cabin door;
the feasibility, size and shape of the nacelle;
the feasibility, size and shape of the engine;
the feasibility, size and shape of the structure of the primary pylon (fixation of the nacelle and fixation of the engine);
the feasibility, size and shape of the structure of the front and rear secondary pylons;
the weight of the pylons (primary and secondary);
the aerodynamic coefficients, such as the drag resulting from installation of the engine under the wing;
the consequence that shattering of the engine has for the structure and the airplane systems;
the positioning of the pylons on the nacelle, engine and wing;
the opening of the nacelle for maintenance operations and thrust reversal;
the influence of the positioning of the engine on the noise of the engine in the airplane and on the ground;
the influence of the positioning of the engine on the temperatures that must be withstood by certain parts of the airplane; and
the influence of water spattered by the landing gears on the positioning of the engine.

Figure 2:
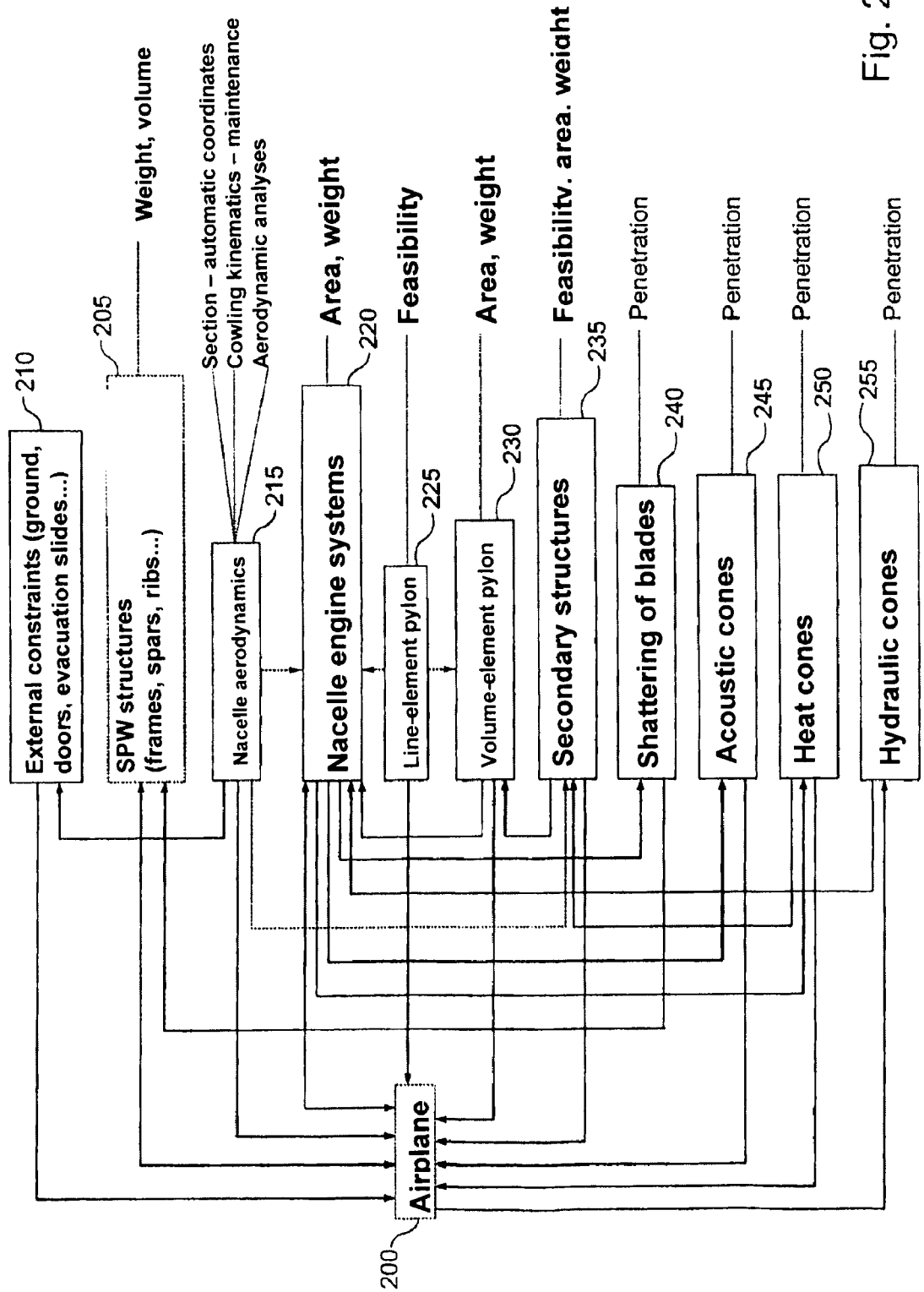

FIG. 2 schematically illustrates an example of the study environment for positioning a propulsive element on an airplane, according to the invention, as well as the relationships between this study and the disciplines involved. Each rectangle represents a particular type of analysis. The arrows indicate a major cause-and-effect relationship. The dotted arrows correspond to data transfer between modules, in the form of text. The dotted lines illustrate an example of data determined during the analysis that can be exported from the application, for example in the form of text files. The dotted rectangles represent external modules used for the study.

Each type of analysis is preferably associated with a particular parametric model, certain data of certain parametric models being common. For example, the data associated with a nacelle are used for the aerodynamic study of the nacelle (215) and for the study of the propulsive assembly composed of a nacelle and an engine. As described hereinafter with reference to FIG. 3, the data of a parametric model may be transmitted to another parametric model by using, for example, a function for exporting and importing data in text mode, according to a set of preselected parameters.

As has been mentioned, the optimal positioning of an engine on an airplane is associated with geometric constraints and mathematical constraints. Geometric constraints refer to constraints that may be analyzed visually to determine whether or not they are satisfied. The mathematical constraints are analyzed by comparison of calculated values with limits determined by a specialist.

The geometric constraints include the relationship between the airplane and the ground during landing and takeoff phases. These constraints are analyzed by a team of specialists, and they can be grouped in a parametric model 210. This model interacts in particular with the airplane model and a nacelle model in such a way that a virtual ground associated with the characteristic of the airplane is presented to the user to allow him to determine the clearance present between the ground and nacelle according to the determined position. Similarly, the limits associated with the position of doors and evacuation slides may be represented by planes permitting the user to determine the validity of the position of the nacelle according to the clearance present between these planes and the nacelle.

Another set of geometric constraints is associated with aerodynamic problems, such as drag, caused by the position of the engine under the wing. These constraints are analyzed by another team of specialists and may be grouped in a parametric model 215. This parametric model may also comprise other constraints, in particular constraints related to maintenance, such as the opening of cowlings.

The analysis results may be purely visual, such as the display of virtual grounds, and may be analytical, such as the display of aerodynamic coefficients or the display of coordinates and sections. The representation of isobaric surfaces as well as the representation of the nacelle with cowlings opened and thrust reversers activated permit the user to examine the position of the nacelle visually according to these constraints. The analytical results may be exported, in the form of texts, for example, to be processed by another module of the computer-assisted design software or by another application, as indicated in FIG. 2. An analysis of analytical results permits a more refined analysis than a visual analysis.

Another part of the analysis of the positioning of the propulsive assembly relates to the feasibility of this assembly. This analysis may be achieved by the use of a particular parametric model (220), whose data associated with the nacelle are preferably obtained from the parametric nacelle model 215. The user may examine the feasibility of such an assembly visually. He may also obtain numerical results such as the weights and areas. These results may be exported, for example in the form of text.

The analysis of the positioning of the propulsive assembly may also be directed at the connection between the propulsive assembly and the wing of the airplane, or in other words at the pylon. This analysis is preferably performed in two separate phases. A first phase pertains to the feasibility. This phase preferably uses a line-element representation of the pylon, which is easier to manipulate and for which twisting is more readily perceptible than in an area-element representation, which in addition may cause problems in the computer-assisted design software when the pylon cannot be physically constructed (bugs). The validity determined by the user according to the visual analysis of the line-element representation may be stored in memory in the parametric model and may thus be exported for use in another parametric model or in another application. When the user has determined, preferably visually, that the pylon can be constructed, an area-element or volume-element study may be conducted in a second phase, in order to analyze other types of data, such as areas and weights. A different parametric model is preferably used for each of these two phases (225 and 230). The data of the parametric model associated with the line-element representation of the pylon are preferably exported to the parametric model associated with the volume-element representation of the pylon. The area-element or volume-element representation of the pylon may be displayed. Numerical results such as weights and areas are preferably calculated automatically in the parametric model. These results may be exported.

The analysis of the pylon may be continued by an analysis of secondary structures relating in particular to the aerodynamic elements that cover the pylon at least partly and other elements external to the pylon, used between a propulsive assembly and a wing. The external elements enveloped by the secondary structures comprise in particular the electrical connections and the fluid transfer systems (for air, fuel, etc.). A parametric model is preferably used for this analysis, on the basis of which the user can determine, for example, the feasibility of secondary structures as well as the weight and area thereof. The representation of secondary structures or of a part of the secondary structures may be displayed. Numerical results pertaining in particular to the feasibility, weights and areas are preferably calculated automatically in the parametric model. As in the foregoing, these results may be exported.

It is also necessary to check the position of the engine according to the constraints associated with the structure of the airplane and with the risk of shattering of blades of the engine. A parametric model 240 is preferably dedicated to this analysis. This parametric model is associated with a model—which may or may not be parametric—of the structure of vital parts (205) of the airplane, in such a way that the user can easily determine the clearance between the trajectory of a blade fragment and the vital elements of the airplane. A representation of the modeling of the trajectory of a blade fragment is preferably displayed in such a way that the user is able, as the case may be, to locate the point of impact of blade fragments on the airplane structure as well as the degree of penetration. The information items associated with the point of impact and with the degree of penetration are advantageously determined automatically, and may be exported in text form.

It may also be important to study the influence of the positioning of the engine on the noise heard by the airplane occupants as well as on the ground during the takeoff and landing phases. A parametric model 245 comprising modeling of the sound emissions, for example in the form of an acoustic cone, may be used for this purpose. Such an acoustic cone is preferably displayed in such a way that the user is able, as the case may be, to locate the part of the airplane subject to this constraint. The information items associated with the parts of the airplane subject to this constraint are again determined automatically and may be exported in text form.

Similarly, there may be used a parametric model 250 associated with the influence of the position of the engine on the temperatures that must be withstood by certain parts of the airplane Again in similar manner, there may also be used another parametric model 255 associated with the influence of water spattered by landing gears on the positioning of the engine. As for the acoustic constraints, the thermal and hydraulic constraints may be represented visually by cones. The representations of thermal and hydraulic constraints are preferably displayed in such a way that the user is able, as the case may be, to locate the part of the airplane subject to this constraint. Advantageously, the information items associated with the parts of the airplane subject to these constraints are also determined automatically and may be exported in text form.

Naturally other constraints may be added to the method for aiding in positioning of the engine by creating new parametric models or by adding parameters and/or mathematical relationships to existing parametric models. Similarly, the grouping of constraints by parametric models may be different. For example, it is possible to group the constraints associated with noise and with the risk of shattering in the same parametric model. It is also possible to divide the parametric model associated with the limits of doors and evacuation slides into two separate parametric models.

The analysis of the positioning of a propulsive assembly is partly hierarchical, certain parts of the analysis being arranged in order and others not. For example, the analysis of secondary structures may be accomplished only after the pylon has been analyzed, whereas the analyses of the acoustic, thermal and hydraulic cones may be carried out in any order whatsoever or in parallel.

The study of all these constraints is traditionally carried out by the experts of the technical fields in question, assisted if necessary by experts in geometry, in methodology or in calculation. However, the use of associative parametric models according to the method of the invention permits an experienced user to establish a first analysis of all of these constraints on the basis of a generic modeling constructed by experts.

The particular implementation of the method according to the invention for positioning an engine on an airplane wing uses about thirty parametric models, representing approximately 1,000 to 2,000 parameters. Naturally, for reasons of clarity and conciseness, each parametric model is not analyzed in detail. Similarly, not all the parameters of a parametric model are studied in succession. The description presents the general principle of the method according to the invention by presenting examples of parametric models and examples of parameters of the parametric models.

A parametric model of a nacelle makes it possible to define, for example, the external shape of the nacelle;
the shape of the nozzle;
the central member of the nozzle;
the engine cowlings and their axis of rotation; and
the thrust reversers and their axis of rotation.

These data may be stored in memory, for example in the forms of points and profiles. The profiles are preferably defined by a set of points and tangents at these points, so that they may be connected by curves. Each profile corresponds to the intersection, with a predetermined plane, of a curve representing an element of the object associated with the model.

Each parametric model preferably additionally comprises a frame of reference, so that one object can be positioned relative to a second. For example, the frame of reference of a nacelle may be a benchmark whose origin is situated on the axis of the nacelle, at a predetermined distance from the extreme front point of the nacelle. The X axis may be the axis of the nacelle, the Y axis may be the axis perpendicular to the X axis in the horizontal plane, and the Z axis may be the axis perpendicular to the X axis in the vertical plane.

Thus the profile of a nacelle may be defined according to an X-Y plane and according to an X-Z plane. In a preferred embodiment, two profiles are determined in the X-Z plane, a low profile and a high profile, since the airplane engines are generally not symmetric in the X-Y plane.

As indicated in the foregoing, several parametric models may be created for the same 3D object. For example, one parametric model may be created with all the essential information items of a nacelle, while another parametric model may be created with all these essential information items of the nacelle and additionally comprising formulas for calculating weights and risks associated with the positioning.

Hereinafter in the description a generic model is a parametric model whose values have not been initialized or have been initialized with default values. The values of the parameters of a generic model may therefore be whatever are desired or may be predetermined so as to be as close as possible to instantiated models. An instantiated model is a generic model in which at least certain values have been initialized. An instantiated model is a "dynamic" model permitting the automation of certain tasks or of certain calculations, and the parameters of which may be modified. An instantiated model is linked dynamically to other instantiated models in order, for example, to automate calculations and to update values, especially coordinate values. A generic model may therefore be considered as the skeleton of an instantiated model. An instantiated model may be used as such in the computer-assisted design software. The values of the instantiated model may also be used to create other instantiated models. For example, the values of an instantiated nacelle model may be used to instantiate a generic model of a propulsive assembly in which values associated with the engine may have been or can be instantiated according to the same method.

Figure 3:
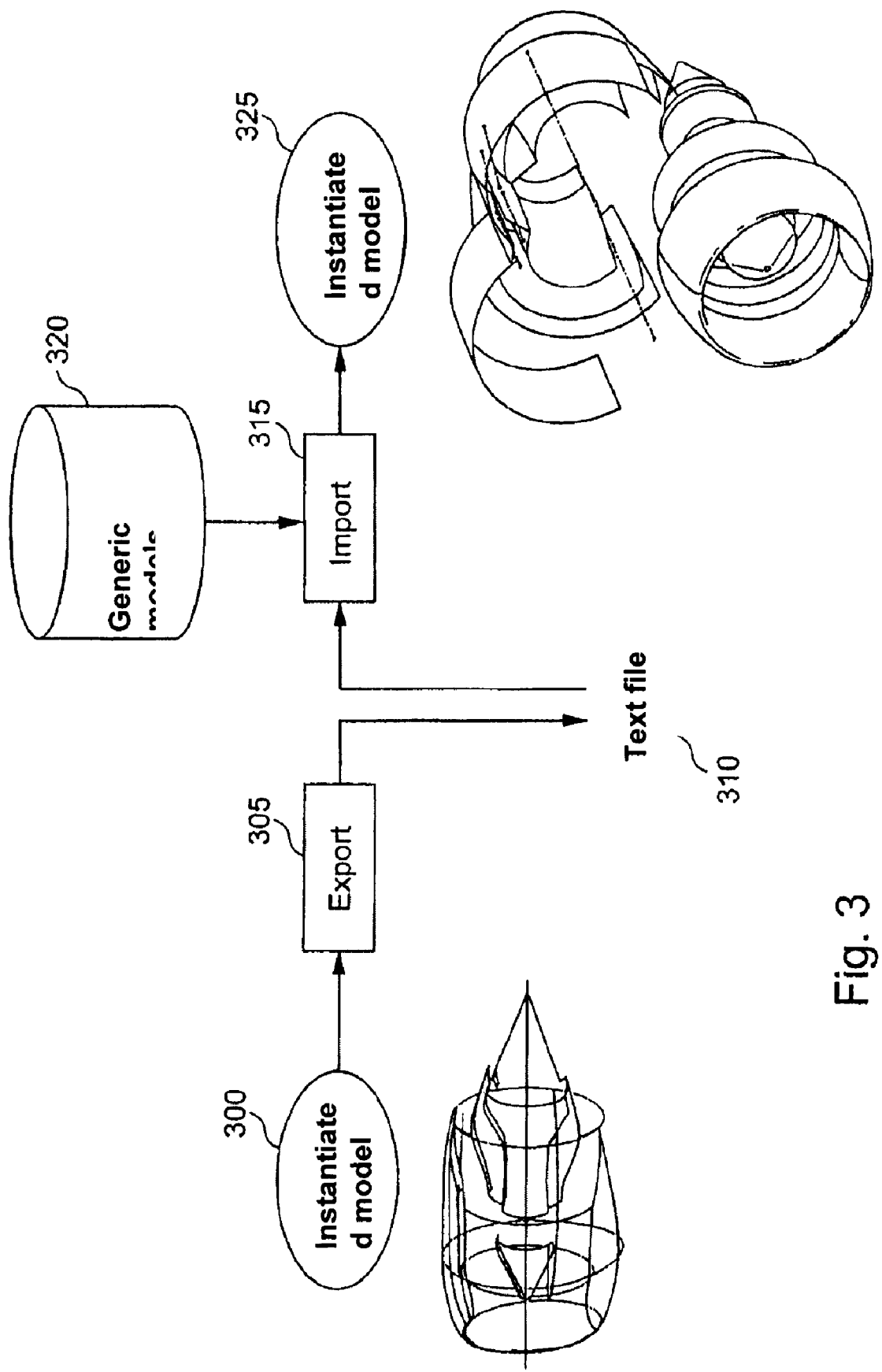
FIG. 3 illustrates an example of a mechanism for instantiating a generic parametric model on the basis of an instantiated model.

To instantiate a generic model on the basis of an instantiated model, one solution is to export the data of the instantiated model in text form and to import them into the generic model to be instantiated. FIG. 3 illustrates this mechanism. The data of an instantiated model (300) are exported (step 305) in text form, for example in the form of a text file (310). The exported data (310) are then imported (step 315) into a generic model selected in a database (320) containing at least one generic model, in order to form a new instantiated model (325). The user may preferably choose the parameters or the profiles to be exported and imported.

Several instantiated models of an object may be created in this way on the basis of one or more instantiated models. For example, an instantiated model of a nacelle comprising a modeling of the aerodynamic behavior of the nacelle may be created from a simple instantiated model of the nacelle. Similarly, this instantiated nacelle model comprising a modeling of the aerodynamic behavior of the nacelle may be used to create an instantiated model of a propulsive assembly comprising the nacelle and an engine.

The use of benchmarks of parametric models, for example of the nacelle and engine, as well as of parameters contained in these models, makes it possible to position the objects represented by these models when the corresponding generic models are instantiated, or in other words when values are given to the parameters that permit this positioning. In addition, the link between the instantiated models is dynamic, so that, if a positioning parameter of an object is modified, the other models are dynamically adapted.

By using this solution, it is possible to divide up the positioning study of a propulsive assembly while associating the intermediate data so that the study is validated in its entirety.

After launching the computer-assisted design software, the user preferably should select an instantiated model of a first object, relative to which a second object is to be positioned. In this example, the first object is an airplane structure or part of the structure of an airplane, including wings, having a predetermined benchmark permitting the addition of elements at precise positions. The benchmark used generally consists in taking the nose of the airplane as origin, the axis of the fuselage as the X axis, the perpendicular to the X axis in the plane of the wings as the Y axis, and the normal to the plane formed by the X and Y axes as the Z axis. There is displayed a numerical model of this first object or of part of this first object.

If the user wishes to determine an initial position of the nacelle according to the limits of doors and evacuation slides, an instance of the parametric model associated with the openings and with the ground is then created according to the data of the instantiated model of the airplane or of the airplane part. This model associated with the apertures and with the ground makes it possible to determine and display the limit areas for the ground, the front cabin doors and the evacuation slides. The positioning of elements associated with this model takes place automatically during instantiation, according to references stored in memory in the model, for example according to the X-Y, Y-Z and Z-X planes of the fuselage and the tangent to the fuselage nose as a function of the benchmark associated with the structure of the airplane. Each area is preferably visualized with a different color. For example, light green may represent the static ground, blue may represent the ground during landing in a crosswind, yellow may represent the ground during landing with the front landing gear retracted, dark green may represent the limits of evacuation slides and red may represent the limits of front cabin doors. By using the parameter editor of the parametric model, the user may define the real dimensions of these elements and the associated limits. For example, for each plane representing the ground (static, landing in a crosswind or with the front landing gear retracted), the user may enter the distances between the front landing point and the X-Y, Y-Z and Z-X planes, the distances between the main landing point and the X-Y, Y-Z and Z-X planes, the roll angle and the pitch angle of the airplane. After these values have been entered or modified, certain variables are calculated to aid the user: in particular, the angle between the X-Y plane and the static ground, the distance between the landing points and the distance between the landing points along the X axis. Similarly, as regards the doors and the evacuation slides, the user may enter or modify the distance between the Y-Z plane and the middle of the door, the minimum distance between the middle of the door and the front end plane of the engine, the relative angle between the evacuation slide and the Y-Z plane along the axis of rotation of the evacuation slide, the width of the evacuation slide and the distance along the Y axis between the axis of rotation of the evacuation slide and the Z-X plane. The planes representing the limits of the doors, evacuation slides and ground may be displayed or hidden at any instant, to permit the user to pinpoint his analysis.

Figure 4:
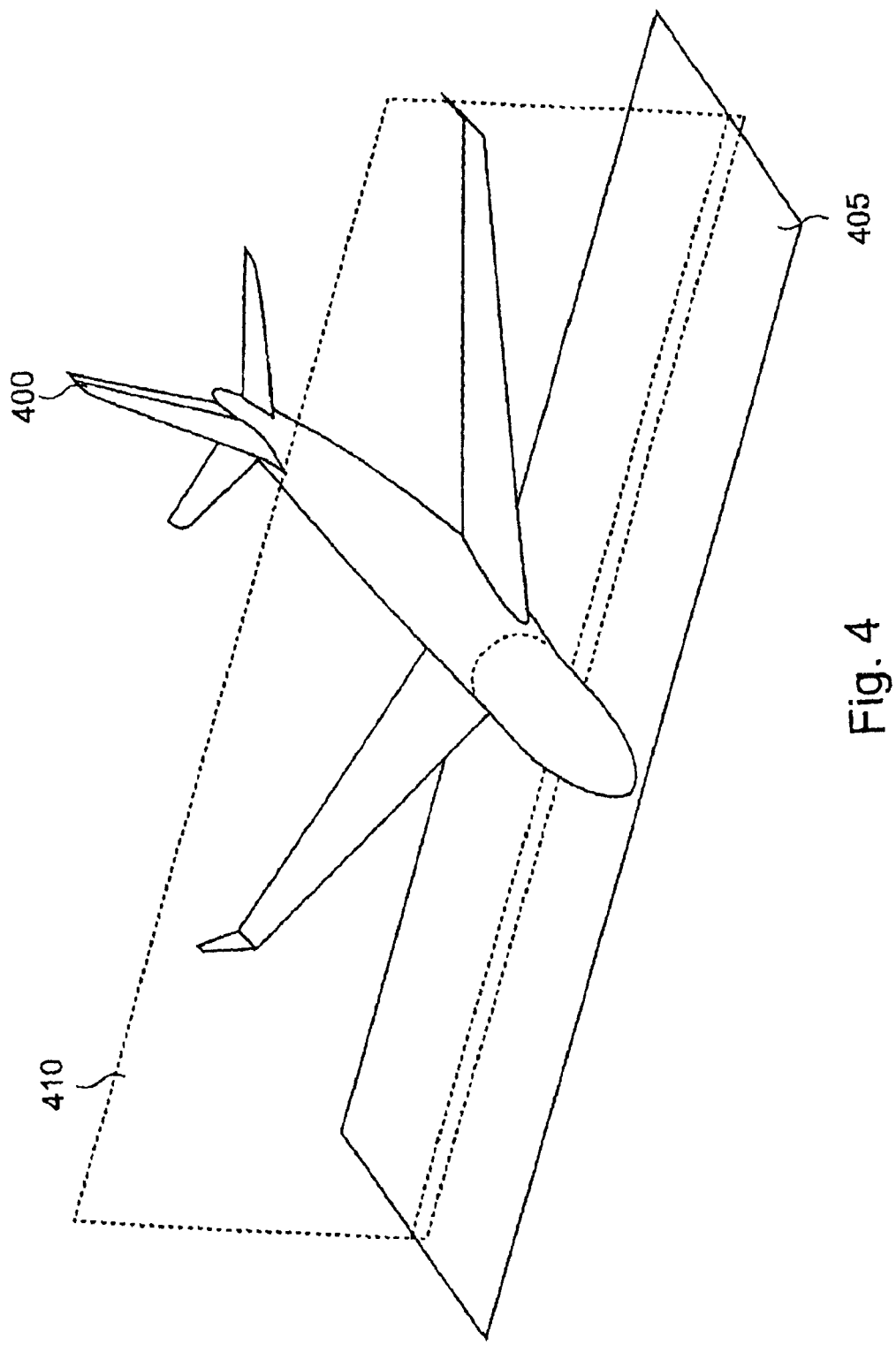
FIG. 4 represents an airplane, the geometric benchmark used and the limits associated with the ground in landing with the front landing gear retracted and with the opening of doors.

FIG. 4 illustrates an airplane 400, the geometric benchmark used and the limits related to the ground for landing with the front landing gear retracted 405 and to the opening of doors 410. FIG. 4 permits a user to determine a priori the possible zones for positioning of a nacelle or of a propulsive assembly according to the displayed constraints. When a nacelle or a propulsive assembly is positioned on the aircraft wing on the basis of parameters and references stored in memory in the instantiated models of the airplane and of the nacelle, a representation equivalent to that of FIG. 4, or a more precise view such as a section through an X-Z plane makes it possible to determine the clearances between the external constraints materialized by planes or lines and the extremities of the nacelle or of the propulsive assembly.

After having displayed the first object and if necessary a representation of a first set of constraints, the user may select an instantiated model of the second object, or in other words the nacelle in this example. An initial position of this object is preferably determined automatically according to certain data of the first object and if necessary according to previously studied constraints. The determination of this initial position, advantageously valid, may be accomplished on the basis of characteristics of the first object and of the approximate placement of the second object, modified according to the possible previously studied constraints. In the described example, the initial position of the nacelle is automatically determined according to the structure of the airplane, and in particular of the wing, and especially according to the constraints associated with the ground, doors and evacuation slides. This initial position may be modified by the user according, for example, to its relative or absolute coordinates. After the initial position of the nacelle has been determined, there is displayed a numerical model thereof or a numerical model of a portion thereof.

Figure 5:
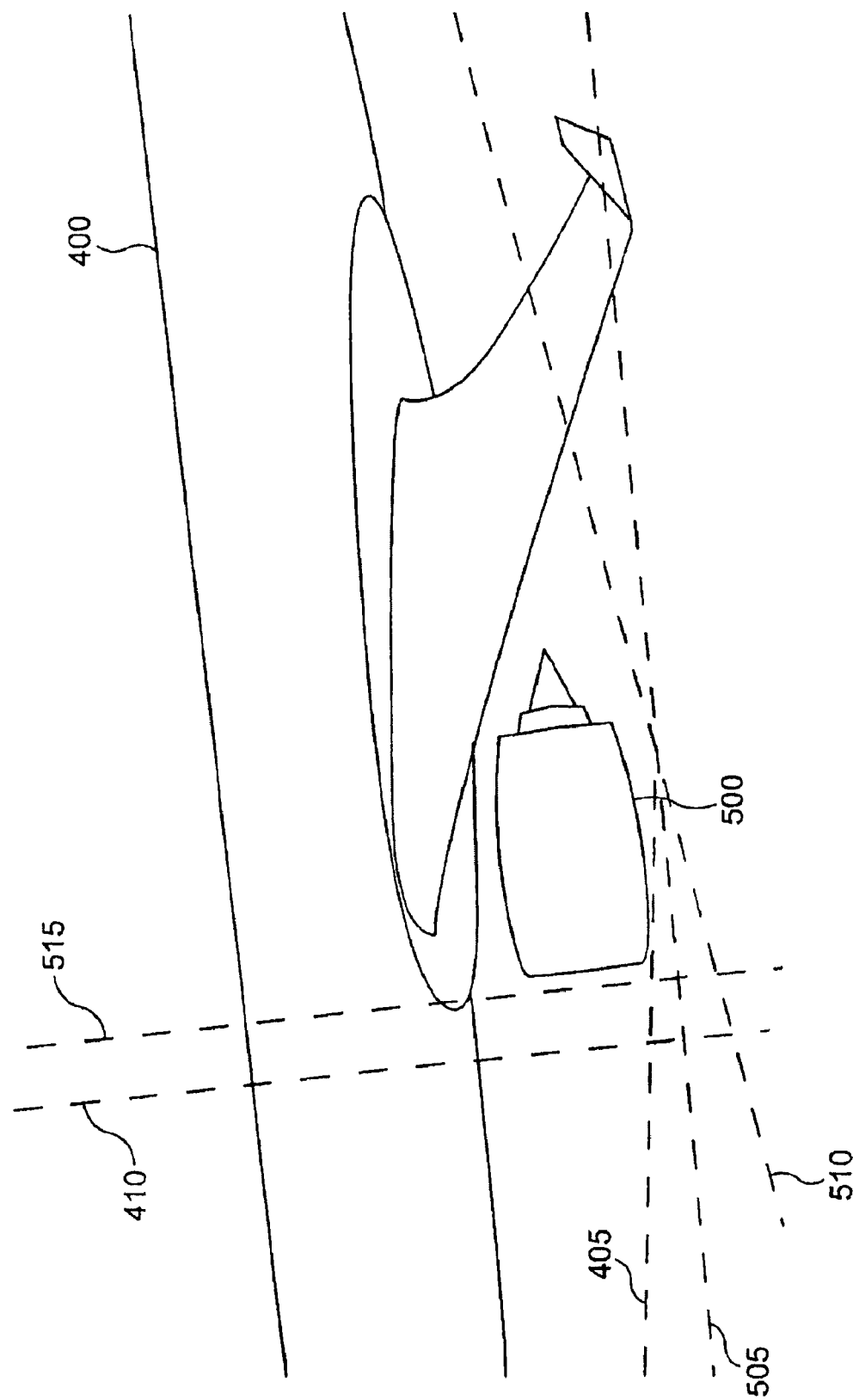
FIG. 5 illustrates a side view of an airplane, on one wing of which there has been positioned a nacelle, as well as the planes of evacuation-slide limits and of door limits.

FIG. 5 illustrates a side view of an airplane, on one wing of which a nacelle has been positioned. As illustrated in this figure, the front extremity of nacelle 500 is situated at a certain distance from limit planes of evacuation slides 410 and from door limit 515. The positioning of the nacelle may therefore be considered as valid relative to these two constraints. The same applies for the ground planes represented by lines 405, 505 and 510, which respectively represent the ground during landing with the front landing gear retracted, the static ground and the ground during landing in a crosswind.

Figure 6:
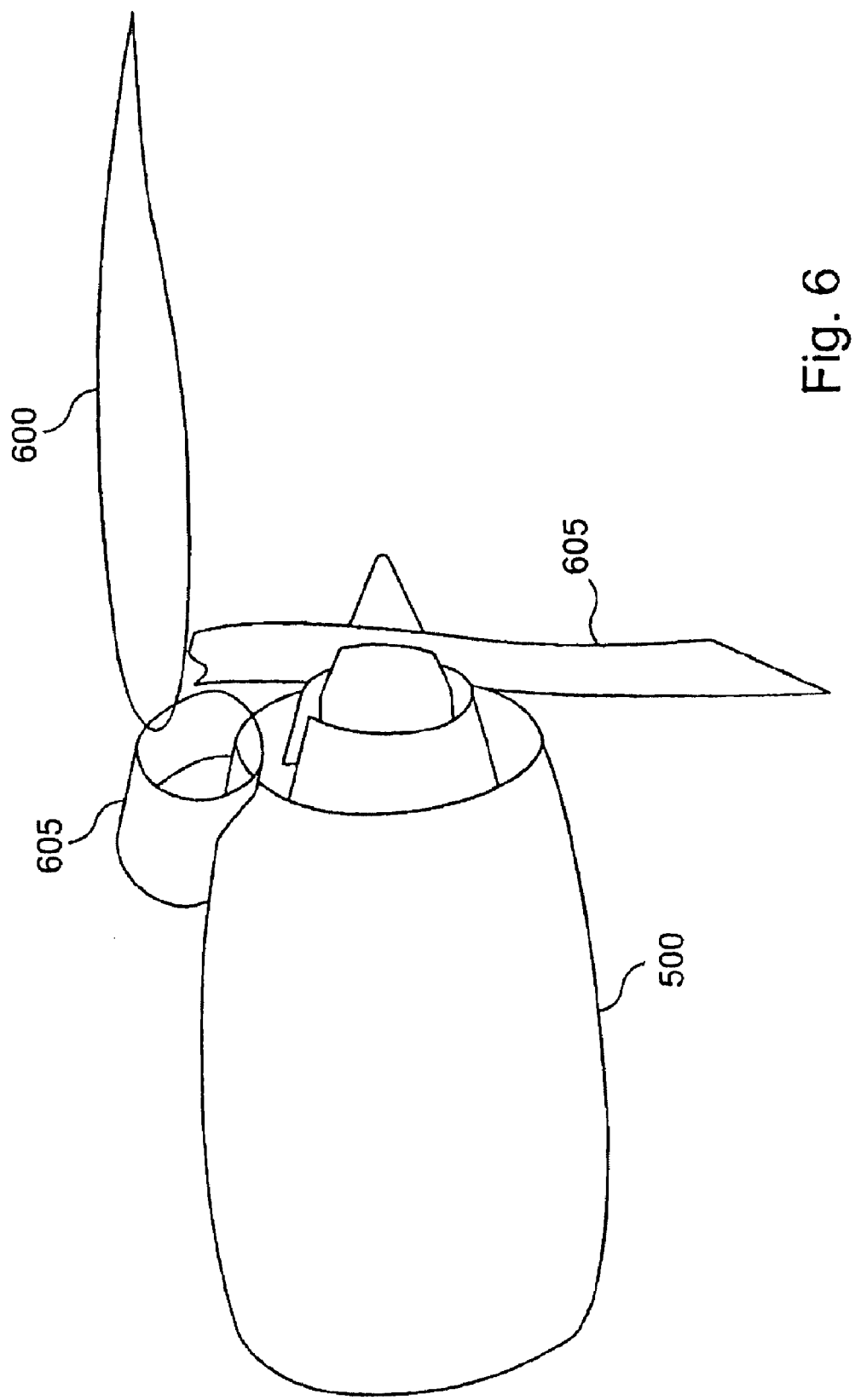
FIG. 6 illustrates the positioning of a nacelle under an airplane wing permitting visual analysis of this position relative to the aerodynamic overpressure limits.

By using an instantiated nacelle model and an instantiated airplane or wing-group model comprising a modeling of aerodynamic constraints, the user may also check the aerodynamics associated with the position of the nacelle relative to the wing group. This analysis may be carried out by comparing the position of isobaric surfaces associated with the wing group with that of the nacelle. FIG. 6 illustrates theoretical surfaces 605 of the limit of aerodynamic overpressures associated with wing group 600. The visual analysis shows that these overpressure limits come into contact with nacelle 500. Depending on the nature of these isobaric surfaces and on the fineness of the analysis, the position of the nacelle may or may not be considered as valid. If the position of the nacelle is considered to be valid, it may be necessary to calculate a penalty associated with the degree of penetration of the isobaric curve into the nacelle. This calculation is preferably integrated into the instantiated model of the nacelle. It may also be integrated into another parametric model such as the instantiated model of the airplane or of the wing group. If the position of the nacelle is not considered to be valid, the position of the nacelle may be modified. The modification of this position may be accomplished, as in the foregoing, with the aid of coordinates of the nacelle. The analyzed constraints are then re-evaluated and their representation is updated.

Similarly, the instantiated models of the airplane and of the nacelle may be used to validate the position of the nacelle according to the constraints associated with thrust reversal and according to the constraints associated with opening of the engine cowlings for engine maintenance, as illustrated in FIGS. 7a and 7b respectively.

It should be noted that the foregoing analysis performed according to the geometric constraints is based on the nacelle alone, whereas the study is conducted with the assembly of nacelle and engine.

After an initial position of the nacelle relative to the wing of the airplane has been determined and validated, it is possible to analyze the characteristics of the pylon, or in other words the junction between the propulsive assembly and the wing. For this analysis, a separate parametric model is preferably used. A generic model of the propulsive assembly comprising a modeling of the pylon is instantiated with the parameters of the nacelle used in the foregoing study as well as with the parameters of an engine selected by the user. These parameters comprise in particular the parameters associated with the nacelle in itself as well as the parameters associated with the positioning thereof relative to the wing. When this propulsive assembly model is instantiated, the characteristics of the pylon are determined automatically according to the positions of the propulsive assembly and of the wing. A line-element pylon 800 is preferably displayed, as represented in FIG. 8, permitting the user to determine whether or not the pylon can be constructed.

It the pylon cannot be constructed, meaning that the position of the nacelle does not permit construction of the pylon, the position of the nacelle is preferably modified, even if, otherwise, the position of the nacelle is valid relative to other constraints. Once again, all the constraints analyzed in the foregoing are re-evaluated, and their representation is updated.

If the pylon can be constructed, an area-element pylon model may be used to continue the study by analyzing in particular the weight and areas of this pylon. This additional study may be conducted on the basis of the same propulsive-assembly instantiated model or on the basis of a generic model instantiated with the data of the instantiated model used for the line-element study of the pylon.

Similarly, the propulsive-assembly instantiated model comprising a line-element or area-element modeling of the pylon may be used to analyze the secondary structures. However, it is preferable to use a separate model. The data of the propulsive-assembly instantiated model comprising an area-element modeling of the pylon may be used to instantiate a propulsive-assembly generic model comprising a modeling of the secondary structures according to the method presented in the foregoing.

After, simultaneously with or before this study, it is possible to analyze the constraints associated with the risk of shattering of the engine. According to these constraints, it must be verified in particular that the blade fragments cannot damage a vital element of the airplane. For that, there may be used an instantiated model of the engine comprising a modeling of the trajectories of blade fragments. These trajectories may be represented, for example, in the form of cones. As in the foregoing, a generic model is instantiated on the basis of data used in the foregoing studies. FIG. 9 illustrates a cone 900 of shattering of turbine blades in such a way that it is possible to determine, according to the structure of wing 600 and of the airplane (not illustrated), whether the vital parts of the airplane would be impacted by a blade fragment.

In the same way, it is possible to analyze the influence of positioning of the engine on the engine noise in the airplane and at ground level, on the temperatures that must be withstood by certain parts of the airplane and the influence of water spattered by the landing gears on the positioning of the engine. These analyses are preferably conducted with the aid of different parametric models, each model comprising a geometric modeling of the constraint being studied. For example, a plurality of acoustic cones may be used: an acoustic cone in front of the inlet to the compression chamber of the engine, an acoustic cone behind the compression chamber of the engine, an acoustic cone behind the combustion chamber and an acoustic cone behind the gas outlet. Each acoustic cone may be defined in the corresponding parametric model, with a shape, a dimension and a position as parameters. The positioning of acoustic cones is accomplished automatically during instantiation of the generic model of the engine comprising this modeling.

As described in the foregoing, the system according to the invention is based on the use of a set of associative parametric models making it possible to establish a link between each type of analysis. Thus, when a parameter such as the Y position of the propulsive assembly is modified, this modification is taken into account in all the parametric models in such a way that the user is rapidly able to determine, by simple visualization of the influence of this modification on the displayed limits and on the results obtained, especially those associated with weights and areas, whether or not this modification is valid according to a set of constraints. For example, if the propulsive assembly is advanced by a few tens of centimeters, the user is rapidly able to visualize if the clearances relative to the limit planes of evacuation slides and the ground are respected, if the pylon is feasible, if it is not too heavy, and so on for all constraints. This dynamic management makes it possible to determine rapidly a position that satisfies all constraints even if each of the constraints must then be validated by a more in-depth analysis.

The user is advantageously free to display or mask certain views or certain constraints materialized by planes, curves, cones or any other representation. In the same way, he may display or mask the analytical results, such as the weights and areas.

It is also possible to add new constraints to a study by using simply a new parametric model associated with this new constraint, while using all of the previously conducted study. It is also possible to compare several positions of propulsive assemblies by instantiating a plurality of similar models with different data.

The study of the positioning of the propulsive assembly on an airplane wing is therefore an iterative process, according to which the constraints are studied successively or simultaneously depending on the nature of these constraints, and according to which the modification of positioning parameters entails an automatic update of the evaluation of the constraints and of the representation thereof.

Depending on the nature and complexity of the objects to be positioned and of the analyzed constraints, the modeling of the constraints may be integrated into the parametric model of an object, in this case the wing group, the nacelle or the engine, or into an independent parametric model. If the modeling of certain constraints is integrated into one or more independent parametric models, these independent parametric models may comprise part of the data of the instantiated models of the objects.

FIG. 10 schematically illustrates certain steps of an example of employment of the invention with the aid of a computer-assisted design software and of an apparatus such as that described with reference to FIG. 1. The method illustrated in FIG. 10 makes it possible to position a first object relative to a second, such as a propulsive assembly relative to an airplane wing according in particular to the constraints cited in the foregoing.

After instantiated parametric models of the first and second objects have been selected (step 1000), for example in a library (1005), there is displayed a numerical representation of the second object (step 1010). The initial position of the first object is determined (step 1015). The initial position of the first object relative to the second object may be determined by the user or preferably is determined automatically according to certain data of the instantiated parametric model of the second object. There is displayed a numerical representation of the first object (step 1020).

A parametric model comprising a modeling of a constraint associated with the position of the first object relative to the second is selected (step 1025), for example in library 1030. A part of the data of a parametric model or models of the first and second object may be copied into the selected parametric model comprising a modeling of a constraint, as suggested by the dotted line connecting library 1005 to step 1025. Similarly, part of the data of one or more parametric models comprising a modeling of previously studied constraints may be copied into the selected parametric model comprising a modeling of a constraint. Alternatively, the modeling of the cited constraint may belong to one of the parametric models of the first and second objects. In this last case it is therefore not necessary to select another parametric model comprising a modeling of the cited constraint.

The cited constraint is evaluated with the aid of its modeling and of the position of the first and/or second object (step 1035). Alternatively, the cited constraint may be evaluated with the aid of its modeling and of the relative position of the first and second objects. The result of evaluation of the constraint is preferably a set of numerical values or numerical shapes, or in other words a set composed of points, curves, surfaces and/or volumes. If the result of the evaluation of the cited constraint consists of numerical values, these are preferably stored in memory in the parametric model comprising the modeling of the cited constraint. These numerical values may be displayed and/or exported (as suggested by the dotted arrow) for use by another application. If the result of the constraint is a numerical shape or a set of numerical shapes, these shapes are preferably displayed (step 1040). The display of these shapes permits the user to determine visually whether or not the position of the first object relative to the second is valid according to the evaluated constraint.

A test is then applied to determine if the user wishes to validate the position of the first object relative to the second according to another constraint (step 1045). If the user wishes to validate the position of the first object relative to the second according to another constraint, the three foregoing steps (steps 1025 to 1040) are repeated. Otherwise a second test is applied to determine if the user wishes to modify the position of the first object relative to the second (step 1050). If the user wishes to modify the position of the first object relative to the second, he determines the new position of the first object (step 1055). As in the foregoing, the position of the first object relative to the second object may be determined by its coordinates or may be determined by selecting one or more points of the second object with the aid, for example, of a mouse. The display of the first object is then modified according to its new position (step 1060).

When the position of the first object is modified, each constraint is re-evaluated according to the modeling of the constraint and the new position of the first object (step 1065). The display of the result of the evaluation of each constraint is modified according to the results of re-evaluation.

The user may then once again evaluate new constraints (step 1045) or modify the position of the first object (step 1050).

Naturally, to satisfy specific needs, a person skilled in the art of the invention will be able to apply modifications in the foregoing description.

The invention claimed is:

1. A method for aiding in positioning of a first object relative to a second object according to at least one constraint associated with the relative position of the first and second objects, the method comprising:
    selecting a parametric model associated with each of the first and second objects;
    displaying a numerical model of the second object according to the parametric model associated with the second object;
    positioning the first object relative to the second object according to parameters of the parametric models associated with the first and second objects;
    displaying a numerical model of the first object according to the parametric model associated with the first object and according to the positioning;
    selecting at least one parametric model comprising a modeling of the at least one constraint;
    for the at least one parametric model comprising the modeling of the at least one constraint,
        acquiring at least one datum associated with the position of at least one of the first and second objects, and
        evaluating the at least one constraint according to the at least one datum.

2. A method according to claim 1, further comprising modifying at least one parameter of at least one of the parametric models associated with the first and second objects, wherein the operations
    acquiring at least one datum associated with the position of at least one of the first and second objects, and
    evaluating the at least one constraint according to the at least one datum,
    being repeated, after the modification of the at least one parameter, for the at least one parametric model comprising a modeling of the at least one constraint.

3. A method according to claim 1, further comprising displaying the result of the evaluation of the at least one constraint.

4. A method according to claim 3, wherein the displaying comprises displaying a graphical indication associated with the at least one constraint in such a way that a visual analysis of the position of the graphical indication relative to at least one of the numerical models associated with the first and second objects makes it possible to validate the position of the first object according to the at least one constraint.

5. A method according to claim 3, wherein the displaying the result of the evaluation of the at least one constraint comprises displaying at least one value, the at least one value making it possible to validate the position of the first object according to the at least one constraint.

6. A method according to claim 1, wherein the at least one parametric model comprising a modeling of the at least one constraint is included in one of the parametric models associated with the first and second objects.

7. A method according to claim 1, wherein at least one datum of the at least one parametric model comprising a modeling of the at least one constraint is imported from one of the parametric models associated with the first and second objects.

8. A method according to claim 1, wherein the second object comprises at least part of an aircraft.

9. A method according to claim 8, wherein the at least one constraint is associated with the following positions: position of doors, position of evacuation slides, position of the ground, relative position of the ground during landing in a crosswind, and relative position of the ground during landing with the front landing gear retracted.

10. A method according to claim 1, wherein the first object comprises at least part of a propulsive assembly for an aircraft.

11. A method according to claim 10, wherein the at least one constraint is associated with aerodynamics of at least part of the first object, with movable pieces of at least part of the first object, with a risk of shattering of at least part of the first object or with noise or heat that may be emitted by at least part of the first object.

12. A device including a processor which executes the method according to claim 1.

13. A non-transitory computer readable storage medium comprising computer executable instructions which when executed by a processor cause the processor to perform the method according to claim 1.

* * * * *